United States Patent
Dummermuth et al.

(10) Patent No.: US 6,501,282 B1
(45) Date of Patent: Dec. 31, 2002

(54) HIGHLY SENSITIVE CAPACITANCE COMPARISON CIRCUIT

(75) Inventors: Ernst H Dummermuth, Chesterland, OH (US); Patrick C Herbert, Mentor, OH (US); Steven M. Galecki, Painesville, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 25 days.

(21) Appl. No.: 09/677,037

(22) Filed: Sep. 29, 2000

(51) Int. Cl.[7] .............................................. G01R 27/26
(52) U.S. Cl. ...................................... 324/679; 324/658
(58) Field of Search ................................ 324/678, 679, 324/649, 658

(56) References Cited

U.S. PATENT DOCUMENTS

| | | | | |
|---|---|---|---|---|
| 3,886,447 A | * | 5/1975 | Tanaka ........................ | 324/678 |
| 4,560,953 A | * | 12/1985 | Bozio ......................... | 331/108 |
| 5,012,207 A | * | 4/1991 | Edwards ...................... | 324/166 |
| 5,194,819 A | * | 3/1993 | Briefer ........................ | 324/684 |
| 5,343,157 A | * | 8/1994 | Deschamps ................. | 324/678 |
| 5,424,650 A | * | 6/1995 | Frick .......................... | 324/688 |
| 5,578,976 A | | 11/1996 | Yao | |
| 5,761,350 A | | 6/1998 | Koh | |
| 5,783,340 A | | 7/1998 | Farino et al. | |
| 5,804,314 A | | 9/1998 | Field et al. | |
| 5,815,051 A | * | 9/1998 | Hamasaki et al. .......... | 333/172 |
| 5,903,380 A | | 5/1999 | Motamedi et al. | |
| 5,959,516 A | | 9/1999 | Chang et al. | |
| 5,995,688 A | | 11/1999 | Aksyuk et al. | |
| 6,046,066 A | | 4/2000 | Fang et al. | |
| 6,071,426 A | | 6/2000 | Lee et al. | |
| 6,094,102 A | | 7/2000 | Chang et al. | |
| 6,100,477 A | | 8/2000 | Randall et al. | |
| 6,114,794 A | | 9/2000 | Dhuler | |
| 6,137,206 A | | 10/2000 | Hill | |
| 6,159,385 A | | 12/2000 | Yao et al. | |
| 6,188,322 B1 | | 2/2001 | Yao et al. | |
| 6,232,841 B1 | | 5/2001 | Bartlett et al. | |
| 6,232,847 B1 | | 5/2001 | Marcy et al. | |
| 6,348,788 B1 | | 2/2002 | Yao et al. | |

OTHER PUBLICATIONS

Toumazou, C. et al., n–step Charge Injection Cancellation Scheme for Very Accurate Switched Current Circuits, Electronic Letters, V.30 (9) 680–681: 1994.

Emmerich, H., et al., A Novel Micromachined Magnetic–Field Sensor, MEMS 99 IEEE Conference, Jan. 17–21, 1999, IEEE Catalog No. 99ch36291c.

Madou, Marc, Fundamentals of Microfabrication, Chapters 2–4, CRC Press LLC, Boca Raton, FL: 1997.

Kovacs, Gregory T.A., Micromachined Transducers Sourcebook, Table of Contents, pp. 77–119 and Index, WCB McGraw–Hill, U.S.A.: 1998.

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

(List continued on next page.)

Primary Examiner—N. Le
Assistant Examiner—T. R. Sundaram
(74) Attorney, Agent, or Firm—Keith M. Baxter; Alexander M. Gerasimow; William R. Walburn

(57) ABSTRACT

A capacitance comparison circuit determines the relative value of two capacitors, such as may be sensor elements, by monitoring voltage changes caused by charge redistribution between the capacitors when they are series connected and then connected alternately in a first and second polarity across a voltage. The direction of change of voltage at the junction of the capacitors with respect to the switching of polarity of their connection precisely reveals which capacitor is larger. Disconnecting the voltage monitor during the switching reduces switching induced errors.

10 Claims, 3 Drawing Sheets

OTHER PUBLICATIONS

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

Miyajima, Hiroshi et al., High–Aspect–Ratio Photolithography for MEMS Applications, J. of Microelectromechanical Sys., V.4(4) 220–229, Dec. 1995.

Lu, Crist et al., A Monolithic Surface Micromachined Accelerometer with Digital Output, IEEE J. of Solid State Circuits, V. 30 (12) 1367–1373, Dec. 1995.

Chen, Ming–Jer et al., Weak Inversion Charge Injection in Analog MOS Switches, IEEE J. of Solid–State Circuits, V. 30 (5) 604–606, May 1995.

Lemkin, Mark A. et al., A Fully Differential Lateral S? Accelerometer with Drift Cancellation Circuitry, Solid–State Sensor and Actuator Workshop, Hilton Head, South Carolina, Jun. 2–6, 1996, pp. 90–93.

Boser, Bernhard E. et al., Surface Micromachined Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5 (4) 283–297, Dec. 1996.

Noriega, Gerardo, Sigma–Delta A/D Converters–Audio and Medium Bandwidths, Technical Notes–DT3 from RMS Instruments website: www.rmsinst.com, 6 pages, Feb. 1996.

Internet page: Decimator Filter DLL, NeuroDimension Inc.: www.nd.com , May 31, 2001.

U.S. patent application No.: 09/406,654, filed on Sep. 27, 1999.

U.S. patent application No.: 09/400,125, filed on Sep. 21, 1999.

U.S. patent application No.: 09/406,509, filed on Sep. 28, 1999.

U.S. patent application No.: 09/955,493, filed on Sep. 18,2001.

U.S. patent application No.: 09/955,494, filed on Sep. 18, 2001.

U.S. patent application No.: 09/675,861, filed on Sep. 29, 2000.

* cited by examiner

US 6,501,282 B1

HIGHLY SENSITIVE CAPACITANCE COMPARISON CIRCUIT

BACKGROUND OF THE INVENTION

1. Field of the Invention

The present invention relates generally to circuits for measuring electrical capacitance and in particular to a circuit for comparing the relative value capacitances, the circuit finding use in precision electronic sensors and the like.

2. Background of the Invention

A wide range of sensor applications use capacitors as sensing elements. The signal to be measured modifies the capacitor and a sense circuit detects changes in the capacitance of the capacitor to produce a corresponding electrical output.

Position, for example, can be measured by attaching opposite plates of a capacitor to separate structures which will be moving with respect to each other. The capacitor formed by the plates will have a capacitance that is a function of the plate's separation. Thus measurement of the capacitance can provide an electrical output indicating relative position of the structures.

Capacitance position sensors are an attractive option for Micro Electro-Mechanical Systems (MEMS). Microscopic movable plate capacitors are easily integrated into MEMS and fabricated using the same integrated circuit techniques used to construct the MEMS. Unfortunately, at the MEMS scale, the changes in capacitance that can be effected by typical movements of the MEMS components are very small, for example $10^{-17}$ Farads. What is needed is a precise and stable circuit capable of resolving such small capacitance changes.

SUMMARY OF THE INVENTION

The present invention provides a simple and accurate measurement of the relative size of two capacitors by connecting them in series, then monitoring the voltage at their junction as the series connected capacitors are alternately connected in a first polarity and a second polarity across an arbitrary power and ground connection. If the capacitors are exactly equal, the voltage at their junction will not change. If they differ, the voltage at the junction will be greater when the smaller capacitor is connected to ground and the larger capacitor is connected to the power connection. The changes in voltage, as a function of the switched polarity, may be detected with a comparator storing an earlier junction voltage in a reference capacitor for comparison at the next polarity switch with a later junction voltage. The offset voltage of the comparator may be nulled by modifying the voltage stored in the reference capacitor by the offset voltage provided by the comparator itself during a calibration mode.

Importantly, switching noise from the switching of the polarity of the series connected capacitors is managed by disconnecting the sensing comparator during the switching period.

Specifically, then, the present invention provides a capacitance comparison circuit for comparing the capacitance of a first and second capacitor. The circuit includes a switching network connecting the first and second capacitors to connect them in one of two modes. In the first mode, the first and second capacitor are in series between the power and ground connections with one terminal of the first capacitor connected to power and one terminal of the second capacitor connected to ground. In the second mode, the first and second capacitor are in series between the power and ground connections with one terminal of the second capacitor connected to power and one terminal of the first capacitor connected to ground. A voltage monitor compares the voltage at a junction of the first and second capacitor in the first mode to the voltage at the junction between the first and second capacitor in the second mode to provide an output signal indicating which of the first and second capacitors has greater capacitance and the switching network disconnects the voltage monitor in between the first and second modes.

Thus it is one object of the invention to provide a simple means of precisely comparing two capacitances without the need for precision voltage, time or capacitive references. The power connection may have an arbitrary voltage, so long as it is stable between the first and second mode, and the timing of the first and second modes is flexible. Disconnecting the voltage monitor from the switching capacitors during the switching process allows improved resolution of capacitor values to be obtained. In this way, a slight asynchrony between the operations of the switches of he switching networks such as might otherwise produce errors in the measurement, is tolerated.

The voltage monitor may include a third capacitor storing the voltage at the junction of the first and second capacitor in the first mode for later comparison to the voltage at the junction of the first and second capacitor in the second mode.

Thus it is another object of the invention to provide a simple means of comparing a voltage at two different times.

The voltage monitor may impose a reference voltage on the junction between the first and second capacitances during the first mode and the reference voltage may be substantially half a voltage of the power connection.

Thus it is another object of the invention to provide a well characterized voltage on the capacitors that will be within the operating range of circuitry used to analyze the change in voltage, such circuitry which will share the ground and power connections.

The voltage stored on the third capacitor may be a difference between the voltage at the junction of the first and second capacitor in the first mode and an offset voltage of a differential amplifier used to later compare the voltage on the third capacitor to the voltage at the junction of the first and second capacitors in the second mode.

Thus it is another object of the invention to null the effects amplifier offset voltages on the evaluation of the first and second capacitor such as allows differences in capacitance between these two capacitors to be more finely resolved.

The foregoing objects and advantages may not apply to all embodiments of the inventions and are not intended to define the scope of the invention, for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

DETAILED DESCRIPTION OF THE INVENTION

Figure 1:
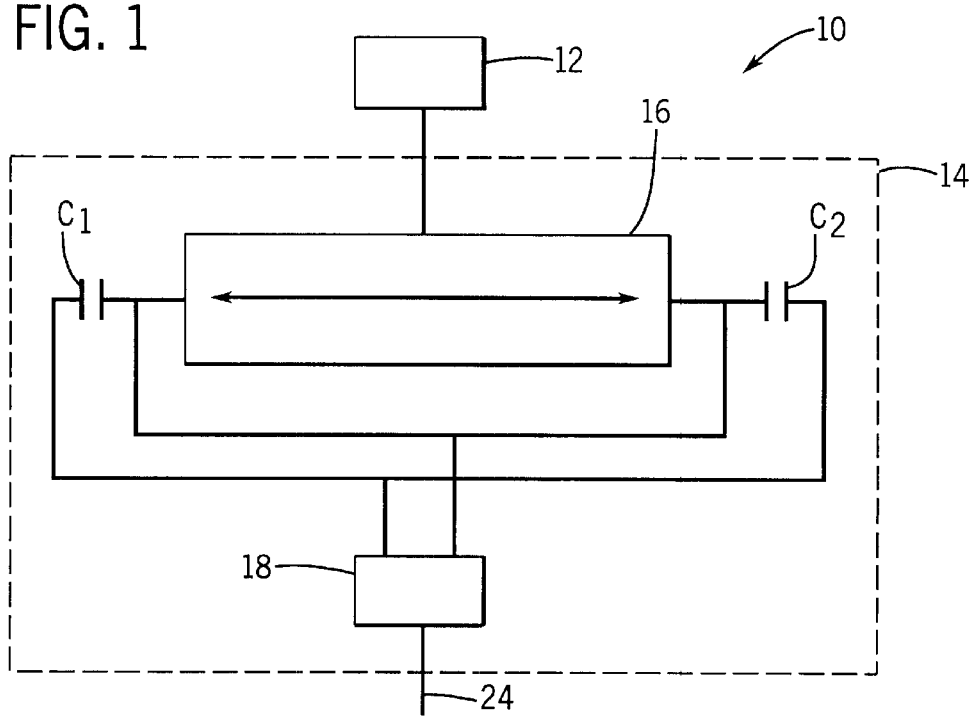
FIG. 1 is a simplified view of a sensor providing a mechanical transducer arm whose position is monitored by capacitors C1 and C2 whose changing capacitance with movement of the transducer arm may be detected by the capacitance comparison circuit of the present invention.

In certain applications, a sensor 10 as shown in FIG. 1 includes an input stage 12 that receives an excitation signal and mechanically couples it to a detector 14. The detector includes a pair of capacitors C1 and C2 connected to a transducer arm 16. Mechanical movement of the transducer arm 16 changes C1 and C2's relative capacitance values in opposition such that C1 increases and C2 decreases or C1 decreases and C2 increases depending upon the direction of movement.

The capacitors C1 and C2 may be designed as to have nominally the same value at a reference position of the transducer arm 16. A capacitance comparison circuit 18 is connected to capacitors C1 and C2 and, by detecting the relative values of C1 and C2, can determine the position of the transducer arm 16 relative to the null position.

Figure 2:
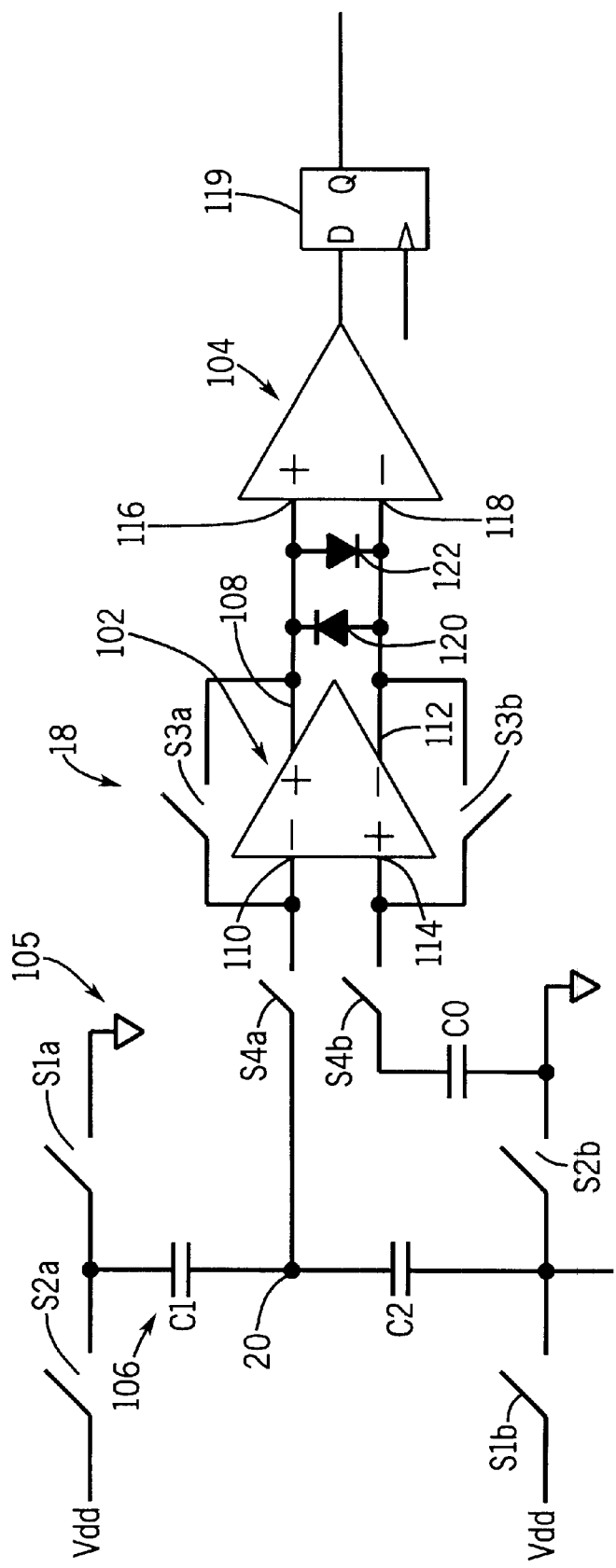
FIG 2 is a schematic diagram of the capacitance comparison circuit of FIG. 1 showing a switching network for changing a polarity of connection of the series connected capacitors C1 and C2 and an operational amplifier for detecting voltage changes at the junction C1 and C2 induced thereby.

As shown in FIG. 2, the capacitance comparison circuit 18 comprises a high impedance, high gain transconductance operational amplifier 102 having dual outputs followed by a comparator 104 and used in conjunction with a switched capacitor network 106 to determine the relative values of two series-connected capacitors C1 and C2. The switched capacitor network 106 preferably switches four switch pairs S1, S2, S3 and S4. The switch pairs may be implemented by solid-state devices, for example, CMOS devices well known in the art.

Switch pairs S1 and S2 operate to connect the series connected capacitors C1 and C2 between power and ground connections first in one direction and then in the opposite directions. More particularly, switch S1a (S2b) couples the top of capacitor C1 (bottom of C2) to ground (GND), and switch S1b (S2a) couples the bottom of capacitor C2 (top of C1) to power (Vdd) typically 5V.

Switch pair S3a, S3b connects the transconductance amplifier's non-inverting output 108 to its inverting input 110 and its inverting output 112 to its non-inverting input 114, respectively.

Switch pair S4a, S4b connects the operational amplifier's differential inputs 110 and 114 to a junction 20 between C1 and C2 and to the top of a reference capacitor C0, respectively. Capacitor C0 may have a capacitance equal to the parallel combination of C1 and C2 to charge balance the operational amplifier when switch pair S3 is closed.

The transconductance amplifier's non-inverting and inverting outputs 108, 112 are applied to the comparator's non-inverting and inverting inputs 116 and 118, respectively. A pair of diodes 120 and 122 is connected in an anti-parallel configuration across the outputs of the amplifier to prevent the amplifier from saturating by clamping its output to a maximum voltage. This allows the transconductance amplifier to recover quickly during the calibration cycle to be ready for the next measurement cycle.

Figure 3:
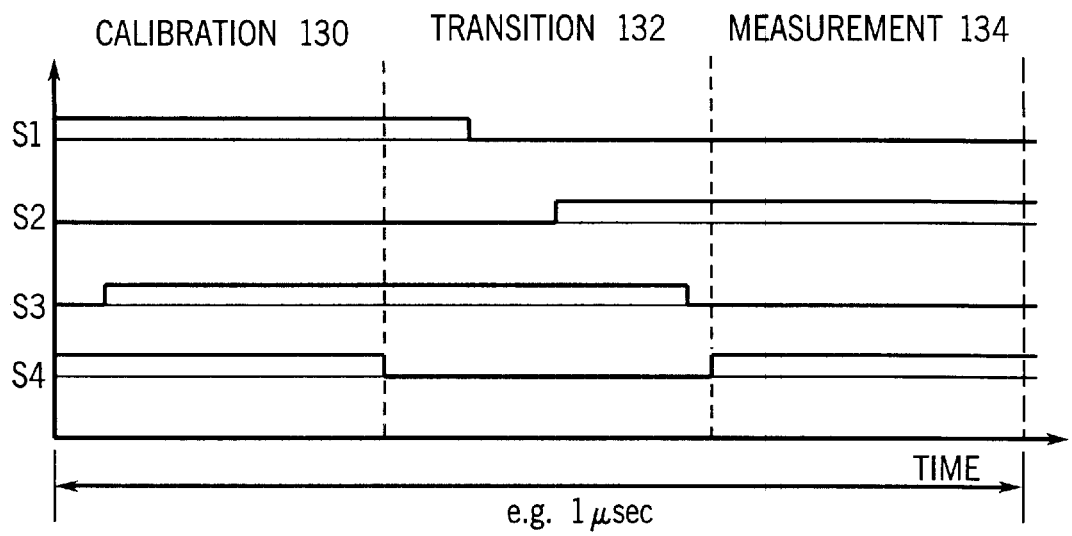
FIG. 3 is a timing diagram for the switching network of the capacitance comparison circuit.

As illustrated in FIG. 3, the switch network preferably actuates switch pairs S1, S2, S3 and S4 at a high sampling rate, e.g. 1 MHz, to repeatedly execute calibration, transition and measurement phases 130, 132 and 134, respectively, to determine the relative sizes of capacitors C1 and C2. During the calibration phase (first mode), the circuit establishes a reference voltage at the junction 20 between capacitors C1 and C2 and across reference capacitor C0. With switches S1 and S4 closed and S2 open, switches S3 are closed thereby shorting each of the transconductance amplifier's double-sided outputs to its inverse inputs. This establishes the reference voltage at the center of the supply range while simultaneously reflecting the transconductance amplifier's offset voltage to its inputs to eliminate DC offset. For example, with the Vdd equal to 5 volts and a 15 mV transconductance amplifier offset, the reference voltages at the junction 20 and C0 would be 2.515V and 2.5V, respectively. The reference voltage does not have to be set at one-half the supply, doing so provides the maximum and most balanced swing.

The capacitance comparison circuit 18 enters the transition phase 132 by opening switch pair S4 to isolate the transconductance amplifier 102. Switch pairs S1 and S2 are opened and closed, respectively, to reverse the supplies thereby providing a switched voltage across the two capacitors C1 and C2. If C1 and C2 are equal, then the resultant charge flow between the capacitors C1 and C2 will cause the voltage at the junction 20 to return to the reference plus offset voltage, producing a true input differential of 0V. If C1 and C2 are not equal, charge on the capacitors will redistribute causing the voltage at the junction 20 to move to a different value. For example, if C1>C2 by just a small amount, then the voltage at the junction 20 moves higher to, for example, 2.517V, producing a true input differential of 0.002V.

Once the voltage at the junction 20 settles, the measurement phase (second mode) is initiated by first opening switch pair S3 and then closing switch pair S4 to apply the junction voltage and the reference voltage at the top of C0 to the transconductance amplifier. This differential input is amplified and applied to the comparator which outputs a digital signal. The digital signal is sampled during the measurement phase by a latch 119 to provide an output indicating the relative size of C1 and C2. Sensitivity to small differences in C1 and C2 is enhanced by eliminating the transconductance amplifier's offset voltage, sampling the junction voltage at a high rate to eliminate the effect of any drift in the power supplies, and amplifying the differential input.

Figure 4:
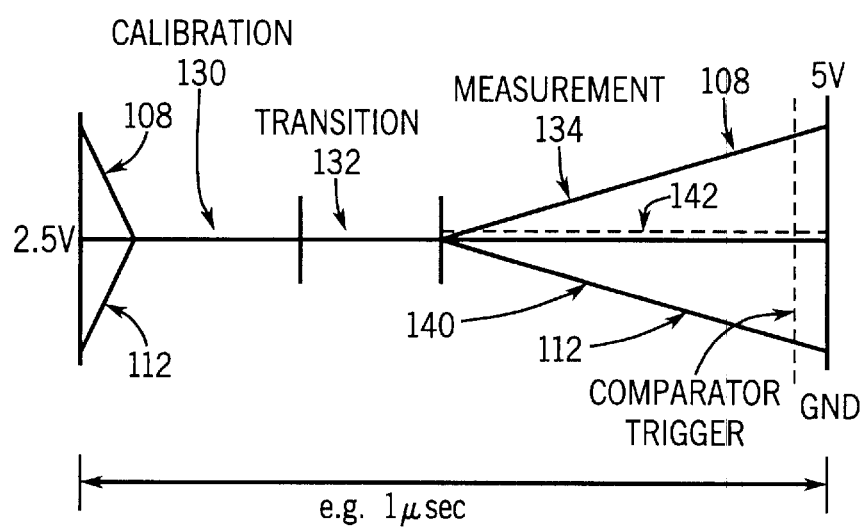
FIG.4 is a plot of the voltage response at the output of the operational amplifier.

As illustrated with ideal waveforms in FIG. 4, the sense circuit samples at, for example, a 1 microsecond sample period (1 MHz sampling rate) and produces a differential voltage 140 that is applied to the comparator. At the beginning of the calibration phase 130, the establishment of the reference voltages as described above applies a true input differential of zero volts at the input of the transconductance amplifier. More particularly transconductance amplifier outputs 108 and 112 merge to the same voltage when switches S3 close during calibration. This produces a zero differential voltage throughout the calibration and transition phases 130 and 132 to prepare the comparator for the measurement phase.

At the onset of the measurement phase 134, assuming C1 does not equal C2, a non-zero true input differential voltage is applied to the transconductance amplifier input and held throughout the measurement phase. The resulting differential output voltage 140 is applied to the comparator over the measurement period until the latch 119 is clocked near the end of the measurement phase. For example, with an amplifier gain of 100, a 0.002V differential input signal would be amplified to 0.2V. Since the circuit is operating at a high sampling rate the amplifier's slew rate must be taken into account. With an example slew rate of 50, the expected 0.2V output, due to amplifier gain alone, will yield an actual output of 0.1V. This 0.1V overcomes the comparator offset 142 such that the comparator makes a valid comparison and outputs a digital signal. Resolutions on the order of 16 bits have been demonstrated.

Resolutions can be further improved by increasing the sample period. The tradeoff is increased delay, possible capacitor droop due to leakage current through the switches and amplifier drift.

Although the sense circuit is generally applicable to compare any two capacitors C1 and C2, its high sensitivity make it particularly well suited for MEMS applications such as current sensors, accelerometers, pressure sensors, and voltage detectors. In the case of voltage and current sensors, the input stage 12 of FIG. 1 must provide an actuation of the transducer arm 16 dependent upon voltage or current respective.

EXAMPLE I

Figure 5:
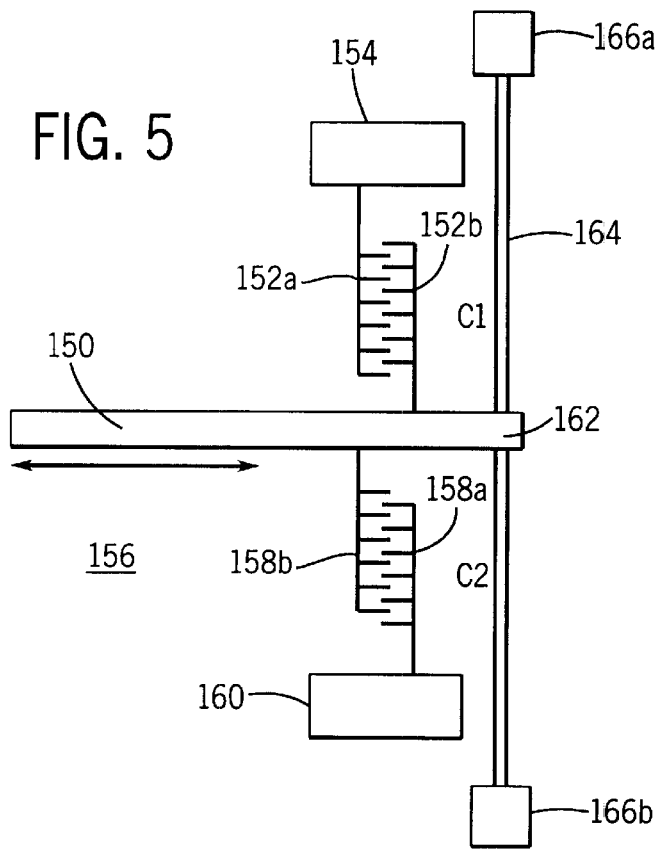
FIG. 5 is a schematic diagram of capacitors C1 and C2 implemented with an inter-digitated MEMS structure.

A suitable configuration for MEMS capacitors C1 and C2 in typical MEMS applications is shown in FIG. 5. In this case, capacitors C1 and C2 change in opposition to each other in response to the movement of a common bridge element 150, which is suspended above substrate 156 and coupled to the input stage (not shown). Note, capacitors C1 and C2 may be configured to change in opposition without sharing a common bridge element. Capacitor C1 includes a pair of inter-digitated fingers 152a and 152b that are connected to a contact 154 on substrate 156 and bridge element 150, respectively, and suspended above underlying substrate 156. Capacitor C2 includes a pair of inter-digitated fingers 158a and 158b that are connected to a contact 160 on substrate 156 and bridge element 150, respectively, and suspended above underlying substrate 156. Bridge element 150 is mechanically coupled to a conducting bridge 164 that is suspended between contacts 166a and 166b, one of which provides junction 20.

In this particular configuration, a force applied to bridge element 150 that causes it to move to the right reduces the overlap between inter-digitated fingers 152a and 152b and increases the overlap between inter-digitated fingers 158a and 158b thereby reducing capacitor C1 and increasing capacitor C2. A force that causes the bridge to move in the opposite direction increases C1 and reduces C2. The structure is configured so that in its relaxed state C1 is nominally equal to C2. Any number of input stages can be configured to exert a force on bridge element 150 to cause C1>C2 or vice-versa in response to an excitation signal. The sense circuit detects the relative values of the capacitors and outputs a digital signal.

It is specifically intended that the present invention not be limited to the embodiments and illustrations contained herein, but that modified forms of those embodiments including portions of the embodiments and combinations of elements of different embodiments also be included as come within the scope of the following claims. For example, while the circuitry shown provides a preferred embodiment of the capacitance comparison circuit 18, the functions of setting a reference voltage, compensating for amplifier offset may not be required in certain embodiments covered by the claims.

We claim:

1. A capacitance comparison circuit for comparing the capacitance of a first and second capacitor comprising:

(a) a switching network having a power and ground connection and communicating with the first and second capacitors to:
   (i) in a first mode connect the first and second capacitor in series between the power and ground connections with one terminal of the first capacitor connected to power and one terminal of the second capacitor connected to ground;
   (ii) in a second mode connect the first and second capacitor in series between the power and ground connections with one terminal of the second capacitor connected to power and one terminal of the first capacitor connected to ground;
(b) a voltage monitor comparing the voltage at a junction of the first and second capacitor in the first mode to the voltage at the junction between the first and second capacitor in the second mode to provide an output signal indicating which of the first and second capacitors has greater capacitance;
wherein the switching network disconnects the voltage monitor in between the first and second modes.

2. The capacitance comparison circuit of claim 1 wherein the voltage monitor includes a third capacitor storing substantially the voltage at the junction of the first and second capacitor in the first mode for later comparison to the voltage at the junction of the first and second capacitor in the second mode.

3. The capacitance comparison circuit of claim 2 wherein the voltage monitor includes a differential amplifier and wherein the voltage monitor stores a difference between the voltage at the junction of the first and second capacitor in the first mode and an offset voltage of the differential amplifier in the third capacitor for comparison by the differential amplifier to the voltage at the junction of the first and second capacitors in the second mode.

4. The capacitance comparison circuit of claim 2 wherein the parallel combination of the first and second capacitors substantially equals the capacitance of the third capacitor.

5. The capacitance comparison circuit of claim 1 wherein the voltage monitor imposes a reference voltage on the junction between the first and second capacitors in the first mode.

6. The capacitance comparison circuit of claim 5 wherein the reference voltage is substantially half of the voltage of the power connection.

7. The capacitance comparison circuit of claim 1 wherein the voltage monitor includes a sampler, storing the results of the comparison when the switch network is in the second mode.

8. A capacitance comparison circuit for comparing the capacitance of a first and second capacitor comprising:

(a) a transconductance amplifier having inverting and non-inverting differential inputs and inverting and non-inverting outputs;
(b) a reference capacitor;
(c) a switching network having a power and ground connection and communicating with the first and second capacitors to:
   (i) in a first mode;
      (A) connect the first and second capacitor in series between the power and ground connections with one terminal of the first capacitor connected to power and one terminal of the second capacitor connected to ground;
      (B) connect the inverting output of the transconductance amplifier to the non-inverting input of the transconductance amplifier and connect the non-inverting output of the transconductance amplifier to the inverting input of the transconductance amplifier to create a reference voltage on the inverting input and non-inverting inputs such as differ by the input offset voltage of the transconductance amplifier;

(C) connect one reference voltage to the junction of the first and second capacitor and one reference voltage to the reference capacitor;

(ii) in a second mode disconnect the first and second capacitor from power and ground and disconnect the inputs of the transconductance amplifier from the junction and third capacitor;

(iii) in a third mode connect the first and second capacitor in series between the power and ground connections with one terminal of the second capacitor connected to power and one terminal of the first capacitor connected to ground;

(iv) in a fourth mode connect one input of the transconductance amplifier to the junction and one input to the reference capacitor to produce a signal indicating a relative size of the first and second capacitors.

9. A sensor comprising:

(a) a first and second capacitor;

(b) a switching network having a power and ground connection and communicating with the first and second capacitors to:

(i) in a first mode connect the first and second capacitor in series between the power and ground connections with one terminal of the first capacitor connected to power and one terminal of the second capacitor connected to ground;

(ii) in a second mode connect the first and second capacitor in series between the power and ground connections with one terminal of the second capacitor connected to power and one terminal of the first capacitor connected to ground;

(c) a voltage monitor comparing the voltage at a junction of the first and second capacitor with the switching network in the first mode to the voltage at the junction between the first and second capacitor with the switching network in the second mode to provide an output signal indicating which of the first and second capacitors has greater capacitance wherein the switching network disconnects the voltage monitor in between the first and second modes.

10. The capacitance comparison circuit of claim 1 wherein the first and second capacitors are physically linked to a sensor arm to vary in capacitance in a monotonically increasing and decreasing manner, respectively, with movement of the sensor arm.

* * * * *